(12) United States Patent
Jeon et al.

(10) Patent No.: US 7,969,180 B1
(45) Date of Patent: Jun. 28, 2011

(54) SEMICONDUCTOR INTEGRATED CIRCUIT

(75) Inventors: Byung-Deuk Jeon, Gyeonggi-do (KR); Dong-Geum Kang, Gyeonggi-do (KR); Young-Jun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/705,807

(22) Filed: Feb. 15, 2010

(30) Foreign Application Priority Data

Dec. 28, 2009  (KR) ........................ 10-2009-0131995

(51) Int. Cl.
*H03K 19/00* (2006.01)
*G01R 31/20* (2006.01)
*G01R 31/28* (2006.01)

(52) U.S. Cl. ....................... 326/16; 324/754.01; 714/733

(58) Field of Classification Search ........................ None
See application file for complete search history.

(56) References Cited

U.S. PATENT DOCUMENTS

| 7,564,255 B2 * | 7/2009 | Nakatsu et al. ............ 324/750.3 |
| 7,724,013 B2 * | 5/2010 | Kim ............................ 324/750.3 |
| 7,830,731 B2 * | 11/2010 | Kim et al. ................. 365/189.17 |
| 7,834,350 B2 * | 11/2010 | Jeong ............................. 257/48 |
| 2005/0259478 A1 * | 11/2005 | An ........................... 365/189.01 |
| 2006/0152236 A1 * | 7/2006 | Kim ............................... 324/755 |
| 2009/0273991 A1 * | 11/2009 | Song ............................ 365/191 |
| 2010/0235692 A1 * | 9/2010 | Murata ........................ 714/718 |

FOREIGN PATENT DOCUMENTS

| JP | 09-092787 | 4/1997 |
| JP | 2003-163246 | 6/2003 |
| KR | 1019940010641 | 10/1994 |

* cited by examiner

*Primary Examiner* — Vibol Tan
*Assistant Examiner* — Dylan White
(74) *Attorney, Agent, or Firm* — IP & T Group LLP (57) ABSTRACT

A semiconductor integrated circuit includes first and second bump pads configured to output data, a probe test pad coupled to the first bump pad, and a pipe latch unit configured to selectively transfer data loaded on first and second data lines to one of the first and second bump pads in response to a pipe output dividing signal during a normal mode, and sequentially transfer the data loaded on the first and second data lines to the probe test pad in response to the pipe output dividing signal during a test mode.

16 Claims, 7 Drawing Sheets

SEMICONDUCTOR INTEGRATED CIRCUIT

CROSS-REFERENCE TO RELATED APPLICATIONS

The present application claims priority of Korean Patent Application No. 10-2009-0131995, filed on Dec. 28, 2009, which is incorporated herein by reference in its entirety.

BACKGROUND OF THE INVENTION

Exemplary embodiments of the present invention relate to a semiconductor integrated circuit, and more particularly, to a semiconductor integrated circuit (IC) having a chip-on-chip structure.

A wire bonding technology has been used to integrate a control semiconductor IC and a main semiconductor IC into a single package. However, the wire bonding technology imposes a limitation on increasing the operating speed of the semiconductor ICs.

To address such a concern, a chip-on-chip package technology may be used instead, which stacks a control semiconductor IC and a main semiconductor IC in a vertical direction. The chip-on-chip package technology is a package technology which identifies positions of both bump pads between a control semiconductor IC and a main semiconductor IC, and directly connects both bump pads without the use of wires. This chip-on-chip package technology may increase an operating frequency due to high-speed signal transmission, reduce total power consumption, and minimize/reduce the overall area of the chip.

However, if the chip-on-chip package technology is applied, the bump pad size of the semiconductor IC may become too small (e.g., 30-μm×30-μm) to properly perform a probe test on the bump pads in a test mode. Therefore, in order to achieve a normal probe test, a probe test pad having a size of about 60-μm×60-μm may need to be separately provided.

SUMMARY OF THE INVENTION

An embodiment of the present invention is directed to a semiconductor IC having a chip-on-chip structure, capable of optimizing an arrangement of pads for a probe test.

In accordance with an embodiment of the present invention, a semiconductor integrated circuit includes first and second bump pads configured to output data; a probe test pad coupled to the first bump pad; and a pipe latch unit configured to selectively transfer data loaded on first and second data lines to one of the first and second bump pads in response to a pipe output dividing signal during a normal mode, and sequentially transfer the data loaded on the first and second data lines to the probe test pad in response to the pipe output dividing signal during a test mode.

In accordance with another embodiment of the present invention, a method for driving a semiconductor integrated circuit includes selectively transferring first and second data loaded on first and second data lines to one of first and second bump pads in response to a pipe output dividing signal during a normal mode; and sequentially transferring the first and second data loaded on the first and second data lines to a probe test pad coupled to the first bump pad in response to the pipe output dividing signal during a test mode.

DESCRIPTION OF SPECIFIC EMBODIMENTS

Exemplary embodiments of the present invention are described below in more detail with reference to the accompanying drawings. The present invention may, however, be embodied in different forms and should not be constructed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawing figures and embodiments of the present invention.

A main semiconductor IC will be described below as an example of a semiconductor IC having a chip-on-chip structure. Although the exemplary embodiment of the present invention may include an appropriate number of bump pads corresponding to a bit organization, only two bump pads are described herein for convenience of explanation.

Figure 1:
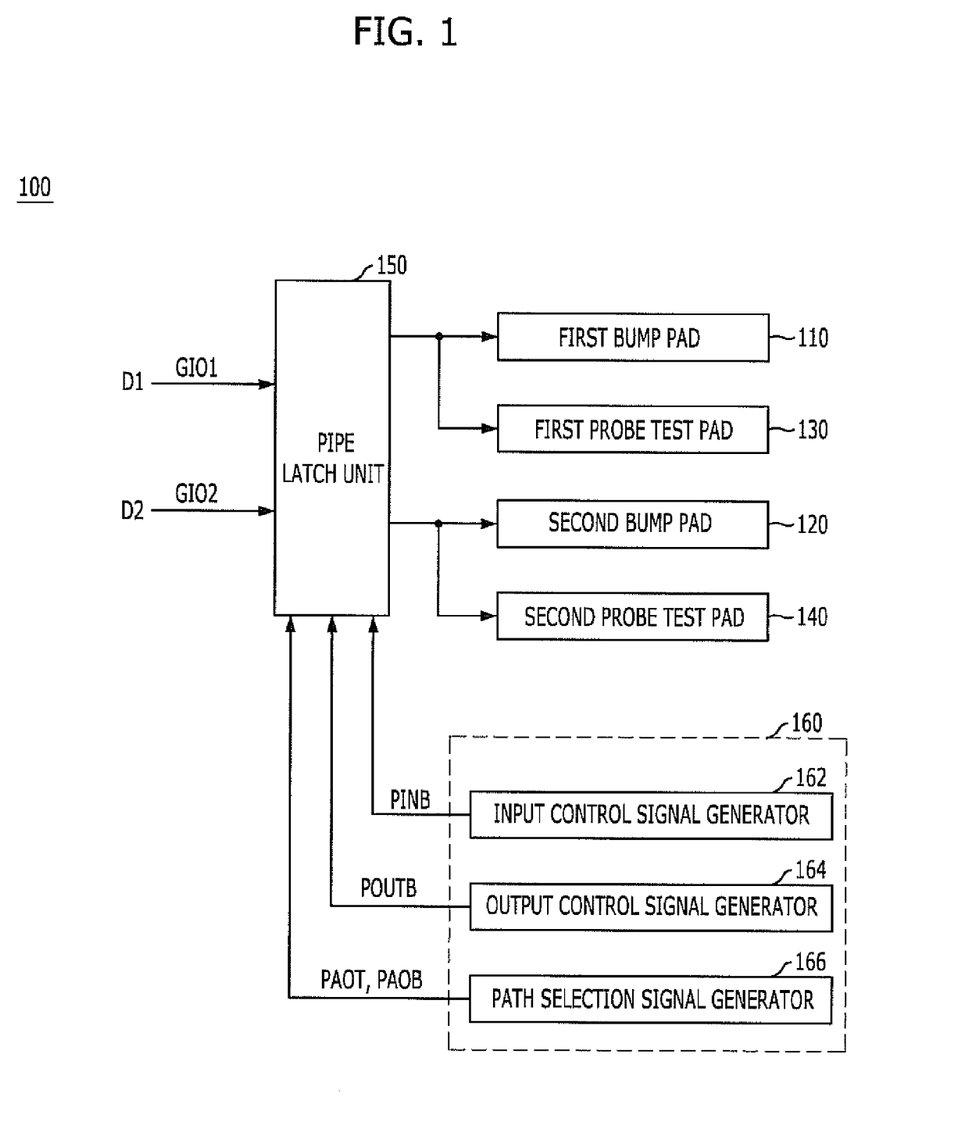
FIG. 1 is a block diagram of a main semiconductor IC.

FIG. 1 is a block diagram of a main semiconductor IC.

Referring to FIG. 1, the main semiconductor IC 100 includes first and second bump pads 110 and 120 configured to output data. The first and second bump pads 110 and 120 are directly coupled to corresponding bump pads provided in a control semiconductor IC (not shown) to transfer data from/to the corresponding bump pads. The first and second bump pads 110 and 120 have a pitch size ranging from approximately 20 μm to approximately 30 μm, although other pitch sizes are also contemplated. The first and second bump pads 110 and 120 may have a pitch size smaller than approximately 20 μm, although other pitch sizes are also contemplated.

The main semiconductor IC 100 further includes first and second pads for a probe test 130 and 140 (hereinafter, referred to as "first and second probe test pads"). The first and second probe test pads 130 and 140 may be large enough to accommodate a probe tip for a probe test. Generally, the first and second probe test pads 130 and 140 have a pitch size of approximately 60 μm, although other pitch sizes are also contemplated. The first and second probe test pads 130 and 140 are provided for performing a probe test in a wafer level process, instead of using the first and second bump pads 110 and 120 for this purpose.

The main semiconductor IC 100 further includes a pipe latch unit 150. Based on whether the main semiconductor is operating in a normal mode or a test mode, the pipe latch unit 150 selectively transfers first and second data D1 and D2 loaded on first and second data lines GIO1 and GIO2 to one of the first and second bump pads 110 and 120 and the first and second probe test pads 130 and 140 in response to a pipe input control signal PINB, a pipe output control signal POUTB, and positive and negative path selection signals PAOT and PAOB.

Figure 2:
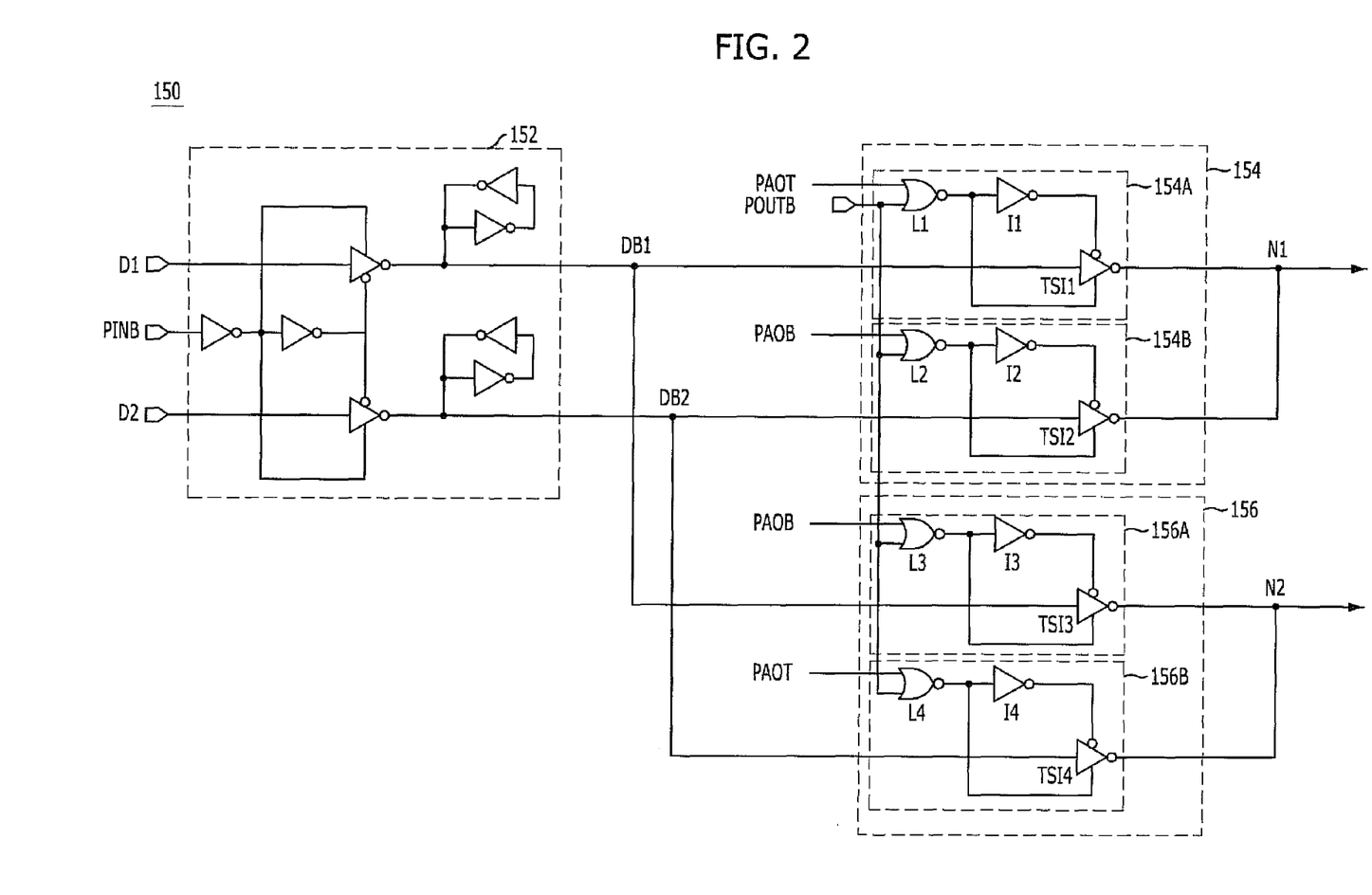
FIG. 2 is a circuit diagram of a pipe latch unit illustrated in FIG. 1.

FIG. 2 is a circuit diagram of the pipe latch unit 150 illustrated in FIG. 1.

Referring to FIG. 2, the pipe latch unit 150 includes an input unit 152, and first and second output units 154 and 156. The input unit 152 receives and latches the first and second data D1 and D2 in response to the pipe input control signal PINB to output the latched data as first and second latched data DB1 and DB2. The first output unit 154 selectively outputs one of the first and second latched data DB1 and DB2 to a first output node N1 in response to the pipe output control signal POUTB and the positive and negative path selection signals PAOT and PAOB based on whether the main semiconductor IC 100 is operating in the test mode or the normal mode. The second output unit 156 selectively outputs the other of the first and second latched data DB1 and DB2 to a second output node N2 in response to the pipe output control signal POUTB and the positive and negative path selection signals PAOT and PAOB based on whether main semiconductor IC 100 is operating in the test mode or the normal mode.

The first output unit 154 includes a first path output unit 154A and a second path output unit 154B.

The first path output unit 154A includes a first NOR gate L1, a first inverter I1, and a first tri-state inverter TSI1. The first NOR gate L1 performs a NOR operation on the pipe output control signal POUTB and the positive path selection signal PAOT, the first inverter I1 inverts an output of the first NOR gate L1, and the first tri-state inverter TSI1 inverts the first latched data DB1 and outputs the inverted data to the first output node N1 in response to an output of the first inverter I1.

The second path output unit 154B includes a second NOR gate L2, a second inverter I2, and a second tri-state inverter TSI2. The second NOR gate L2 performs a NOR operation on the pipe output control signal POUTB and the negative path selection signal PAOB, the second inverter I2 inverts an output of the second NOR gate L2, and the second tri-state inverter TSI2 inverts the second latched data DB2 and outputs the inverted data to the first output node N1 in response to an output of the second inverter I2.

Likewise, the second output unit 156 includes a third path output unit 156A and a fourth path output unit 156B.

The third path output unit 156A includes a third NOR gate L3, a third inverter I3, and a third tri-state inverter TSI3. The third NOR gate L3 performs a NOR operation on the pipe output control signal POUTB and the negative path selection signal PAOB, the third inverter I3 inverts an output of the third NOR gate L3, and the third tri-state inverter TSI3 inverts the first latched data DB1 and outputs the inverted data to the second output node N2 in response to an output of the third inverter I3.

The fourth path output unit 156B includes a fourth NOR gate L4, a fourth inverter I4, and a fourth tri-state inverter T514. The fourth NOR gate L4 performs a NOR operation on the pipe output control signal POUTB and the positive path selection signal PAOT, the fourth inverter I4 inverts an output of the fourth NOR gate L4, and the fourth tri-state inverter TSI4 inverts the second latched data DB2 and outputs the inverted data to the second output node N2 in response to an output of the fourth inverter I4.

Referring back to FIG. 1, the main semiconductor IC 100 further includes a signal generating unit 160 configured to generate plural signals. The signal generating unit 160 includes an input control signal generator 162, an output control signal generator 164, and a path selection signal generator 166. The input control signal generator 162 generates the pipe input control signal PINB so that the first and second data D1 and D2 are input and latched by the input unit 152. The output control signal generator 164 generates the pipe output control signal POUTB so that the first and second latched data DB1 and DB2 latched by the pipe latch unit 150 are output. The path selection signal generator 166 generates the positive and negative path selection signals PAOT and PAOB so that the first and second latched data DB1 and DB2 are selectively output through the first and second output units 154 and 156 of the pipe latch unit 150.

Figure 3:
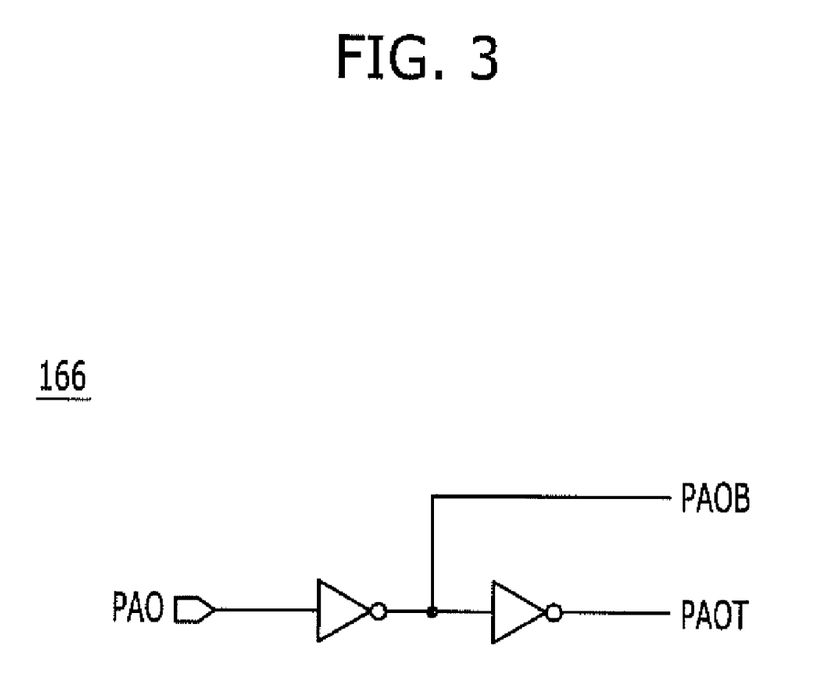
FIG. 3 is a circuit diagram of a path selection signal generator illustrated in FIG. 1.

FIG. 3 is a circuit diagram of the path selection signal generator 166 illustrated in FIG. 1.

Referring to FIG. 3, the path selection signal generator 166 generates the positive and negative path selection signals PAOT and PAOB based on an address signal PAO synchronized with a clock signal (not shown).

Meanwhile, although it is not shown to the drawings, an output driving unit may be provided between the first output unit 154 and the first bump pad 110, and configured to drive the first bump pad 110 in response to one of the first and second latched data DB1 and DB2. Likewise, an output driving unit may be also provided between the second output unit 156 and the second bump pad 120.

Hereinafter, an operation of the main semiconductor IC 100 according to the normal mode and the test mode is explained in detail.

First, in the normal mode, the first and second data D1 and D2 of a memory cell selected according to a read command are input to the input unit 152 through the first and second data lines GIO1 and GIO2. At this time, the input unit 152 latches the first and second data D1 and D2 to output the first and second latched data DB1 and DB2 when the pipe input control signal PINB is activated to a logic low level.

Subsequently, when the pipe output control signal POUTB is activated to a logic low level, the first and second output units 154 and 156 selectively output the first and second latched data DB1 and DB2 to the first and second bump pads 110 and 120 in response to the positive and negative path selection signals PAOT and PAOB.

In a case where the path selection signal generator 166 outputs the positive path selection signal PAOT of a logic low level and the negative path selection signal PAOB of a logic high level when the pipe output control signal POUTB is activated to a logic low level, since the first path output unit 154A of the first output unit 154 is enabled, the first latched data DB1 is output to the first bump pad 110 through the first output node N1. Further, since the fourth path output unit 156B of the second output unit 156 is enabled, the second latched data DB2 is output to the second bump pad 120 through the second output node N2.

On the other hand, in a case where the path selection signal generator 166 outputs the positive path selection signal PAOT of a logic high level and the negative path selection signal PAOB of a logic low level when the pipe output control signal POUTB is activated to a logic low level, since the second path output unit 154B of the first output unit 154 is enabled, the second latched data DB2 is output to the first bump pad 110 through the first output node N1. Further, since the third path output unit 156A of the second output unit 156 is enabled, the first latched data DB1 is output to the second bump pad 120 through the second output node N2.

Next, in the test mode, a probe tip for a probe test (not shown) may be provided and coupled to the first and second probe test pads 130 and 140. The first and second data D1 and D2 of a memory cell selected according to a read command are input to the input unit 152 through the first and second data lines GIO1 and G102. At this time, the input unit 152 latches the first and second data D1 and D2 to output the first and second latched data DB1 and DB2 when the pipe input control signal PINB is activated to a logic low level.

Subsequently, when the pipe output control signal POUTB is activated to a logic low level, the first and second output units 154 and 156 selectively output the first and second latched data DB1 and DB2 to the first and second probe test pads 130 and 140 in response to the positive and negative path selection signals PAOT and PAOB.

In a case where the path selection signal generator 166 outputs the positive path selection signal PAOT of a logic low level and the negative path selection signal PAOB of a logic high level when the pipe output control signal POUTB is activated to a logic low level, since the first path output unit 154A of the first output unit 154 is enabled, the first latched data DB1 is output to the first probe test pad 130 through the first output node N1. Further, since the fourth path output unit 156B of the second output unit 156 is enabled, the second latched data DB2 is output to the second probe test pad 140 through the second output node N2.

On the other hand, in a case where the path selection signal generator 166 outputs the positive path selection signal PAOT of a logic high level and the negative path selection signal PAOB of a logic low level when the pipe output control signal POUTB is activated to a logic low level, since the second path output unit 154B of the first output unit 154 is enabled, the second latched data DB2 is output to the first probe test pad 130 through the first output node N1. Further, since the third path output unit 156A of the second output unit 156 is enabled, the first latched data DB1 is output to the second probe test pad 140 through the second output node N2.

As described above, the main semiconductor IC 100 may include the first and second probe test pads 130 and 140 corresponding to the first and second bump pads 110 and 120 one to one. For example, when the main semiconductor IC 100 has a bit organization of "x128", 128 bump pads are provided to the main semiconductor IC 100 and 128 probe test pads are also provided to the main semiconductor IC 100. Since the number of the probe test pads also increase according as the bit organization increases, an entire area of the main semiconductor IC 100 may be increased.

Figure 4:
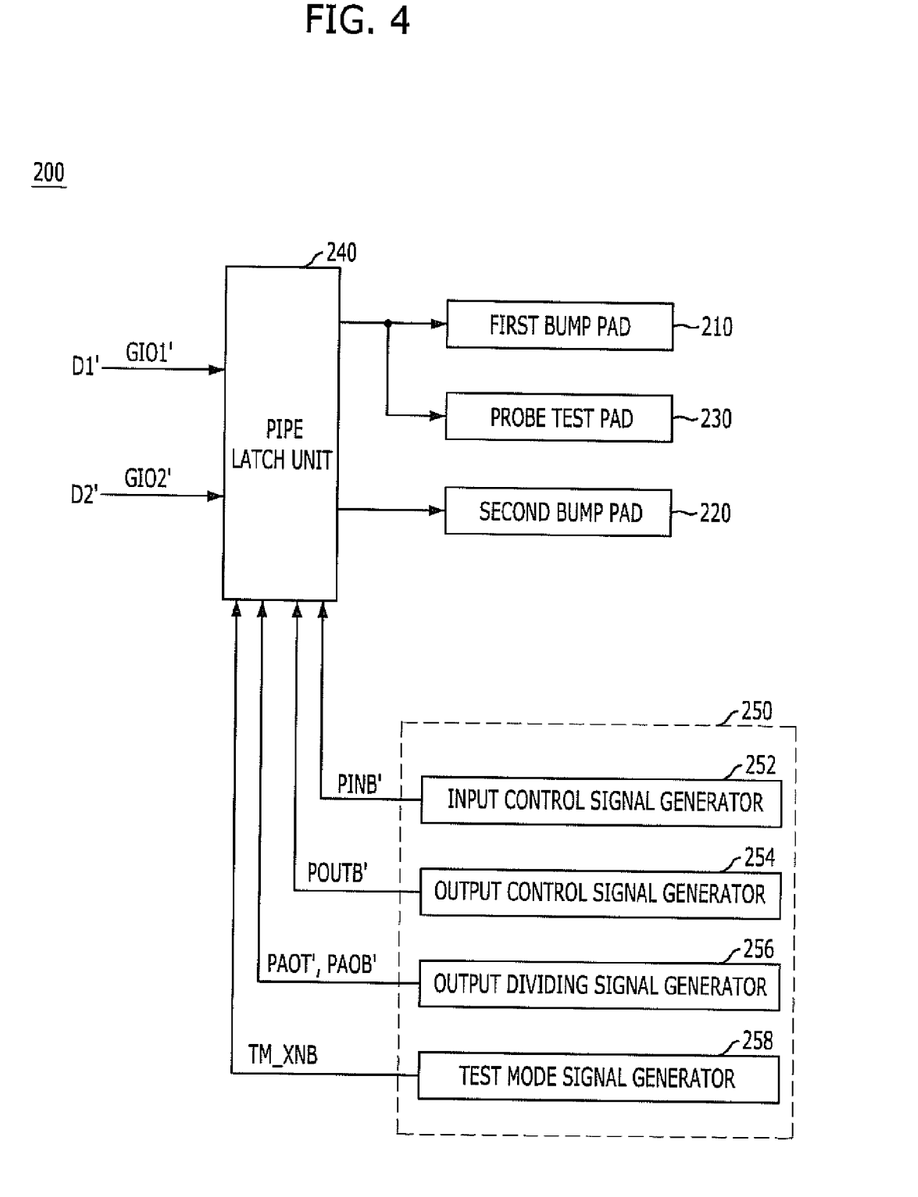
FIG. 4 is a block diagram of a main semiconductor IC in accordance with an embodiment of the present invention.

FIG. 4 is a block diagram of a main semiconductor IC in accordance with an embodiment of the present invention.

Referring to FIG. 4, the main semiconductor IC 200 includes first and second bump pads 210 and 220 configured to output data. Since the first and second bump pads 210 and 120 are substantially the same as those of FIG. 1, their detailed description will be omitted for conciseness.

The main semiconductor IC 100 further includes a pad for a probe test 230 (hereinafter, referred to as "a probe test pad 230"). The probe test pad 230 is coupled to the first bump pad 210 to perform a probe test during a test mode, instead of using the first and second bump pads 210 and 220 for this purpose. The probe test pad 230 has a size to accommodate a probe tip for a probe test. For example, the probe test pad 230 may have a size of approximately 60-μm×60-μm, although other sizes for the test pad are also contemplated.

The main semiconductor IC 100 further includes a pipe latch unit 240. During a normal mode, the pipe latch unit 240 selectively transfers first and second data D1' and D2' loaded on first and second data lines GIO1' and GIO2' to one of the first and second bump pads 210 and 220 in response to positive and negative pipe output dividing signals PAOT' and PAOB'. During a test mode, the pipe latch unit 240 sequentially transfers the first and second data D1' and D2' loaded on the first and second data lines GIO1' and GIO2' to the probe test pad 230 in response to the positive and negative pipe output dividing signals PAOT' and PAOB'.

Figure 5:
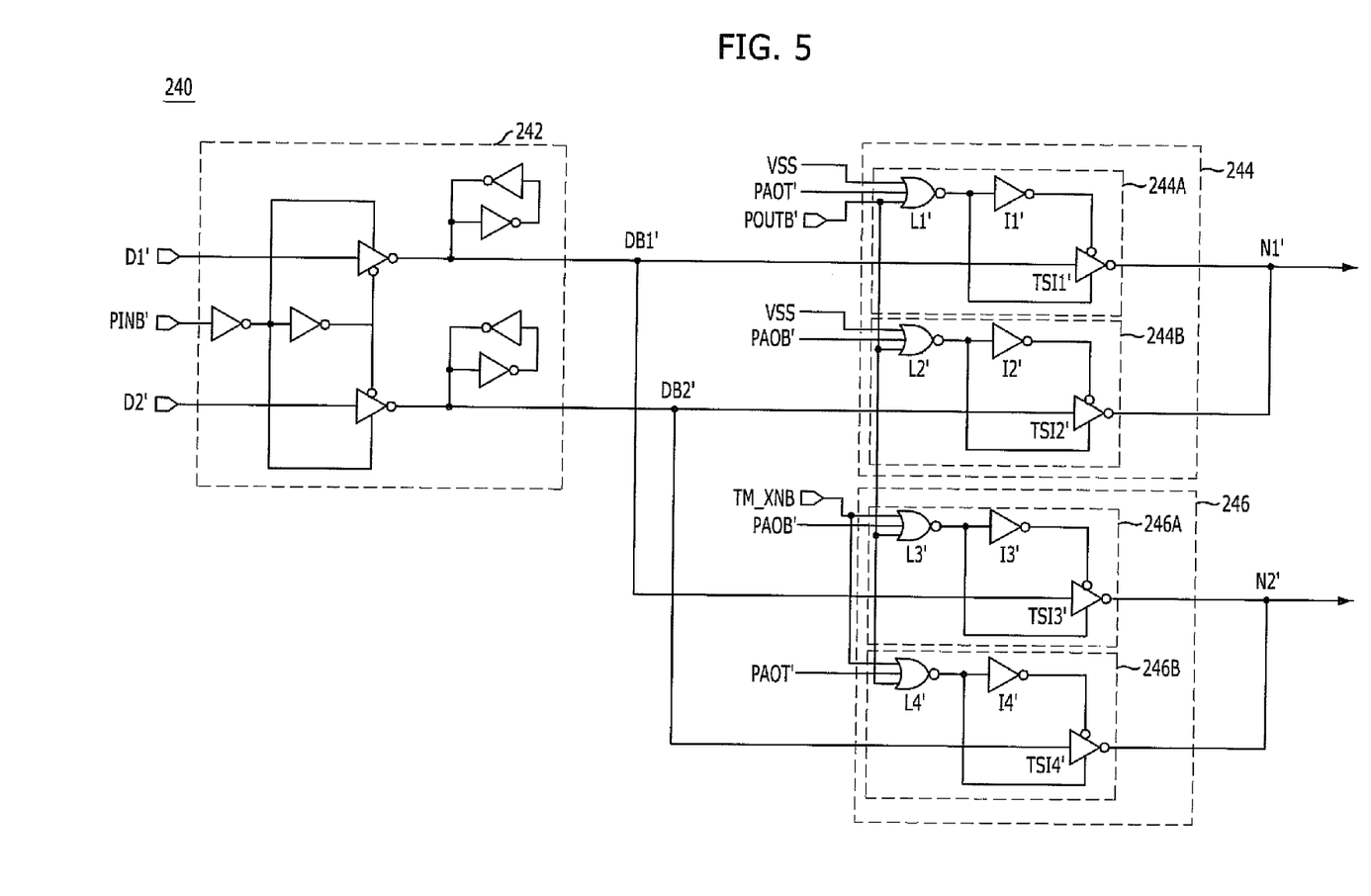
FIG. 5 is a circuit diagram of a pipe latch unit illustrated in FIG. 4.

FIG. 5 is a circuit diagram of the pipe latch unit 240 illustrated in FIG. 4.

Referring to FIG. 5, the pipe latch unit 240 includes an input unit 242, and first and second output units 244 and 246.

The input unit 242 receives and latches the first and second data D1' and D2' in response to a pipe input control signal PINB' to output the latched data as first and second latched data DB1' and DB2'. The first output unit 244 outputs one of the first and second latched data DB1' and DB2' to the first bump pad 210 through a first output node N1' in response to the positive and negative pipe output dividing signals PAOT' and PAOB' and a pipe output control signal POUTB' during the normal mode, and sequentially outputs the first and second latched data DB1' and DB2' to the probe test pad 230 in response to the positive and negative pipe output dividing signals PAOT' and PAOB' during the test mode. The second output unit 246 outputs the other of the first and second latched data DB1' and DB2' to the second bump pad 220 through a second output node N2' in response to the positive and negative pipe output dividing signals PAOT' and PAOB' and the pipe output control signal POUTB' during the normal mode. Herein, the first output unit 244 is enabled during both of the normal and test modes whereas the second output unit 246 is enabled only, for example, during the normal mode and disabled in response to a test mode signal TM_XNB during the test mode.

The first output unit 244 includes a first path output unit 244A and a second path output unit 244B.

The first path output unit 244A includes a first NOR gate L1', a first inverter I1', and a first tri-state inverter TSI1'. The first NOR gate L1' performs a NOR operation on a ground voltage level signal VSS, the pipe output control signal POUTB', and the positive pipe output dividing signal PAOT', the first inverter I1' inverts an output of the first NOR gate L1', and the first tri-state inverter TSI1' inverts the first latched data DB1' and outputs the inverted data to the first output node N1' in response to an output of the first inverter I1'.

The second path output unit 244B includes a second NOR gate L2', a second inverter I2', and a second tri-state inverter TSI2'. The second NOR gate L2' performs a NOR operation on the ground voltage level signal VSS, the pipe output control signal POUTB', and the negative pipe output dividing signal PAOB', the second inverter I2' inverts an output of the second NOR gate L2', and the second tri-state inverter TSI2' inverts the second latched data DB2' and outputs the inverted data to the first output node N1' in response to an output of the second inverter I2'. For illustration purposes, the ground voltage level signal VSS in the preferred embodiment of the present invention is shown to be applied to the first and second path output units 244A and 244B. However, the ground voltage level signal VSS is optional and is only applied in FIG. 5 to allow the first output unit 244 to have the similar configuration to the second output unit 246.

Likewise, the second output unit 246 includes a third path output unit 246A and a fourth path output unit 246B.

The third path output unit 246A includes a third NOR gate L3', a third inverter I3', and a third tri-state inverter TSI3'. The third NOR gate L3' performs a NOR operation on the pipe output control signal POUTB', the negative pipe output control signal PAOB', and the test mode signal TM_XNB, the third inverter I3' inverts an output of the third NOR gate L3', and the third tri-state inverter TSI3' inverts the first latched data DB1' and outputs the inverted data to the second output node N2' in response to an output of the third inverter I3'.

The fourth path output unit 246B includes a fourth NOR gate L4', a fourth inverter I4', and a fourth tri-state inverter TSI4'. The fourth NOR gate L4' performs a NOR operation on the pipe output control signal POUTB', the positive path selection signal PAOT', and the test mode signal TM_XNB, the fourth inverter I4' inverts an output of the fourth NOR gate L4', and the fourth tri-state inverter TSI4' inverts the second latched data DB2' and outputs the inverted data to the second output node N2' in response to an output of the fourth inverter I4'.

Referring back to FIG. 4, the main semiconductor IC 200 further includes a signal generating unit 250 configured to generate plural signals. The signal generating unit 250 includes an input control signal generator 252, an output control signal generator 254, an output dividing signal generator 256, and a test mode signal generator 258.

The input control signal generator 252 generates the pipe input control signal PINB' so that the first and second data D1' and D2' on the first and second data lines GIO1' and GIO2' are input and latched by the input unit 242. The output control signal generator 254 generates the pipe output control signal POUTB' so that the first and second latched data DB1' and DB2' latched by the input unit 242 are output. The output dividing signal generator 256 generates the positive and negative output dividing signals PAOT' and PAOB' so that the first and second latched data DB1' and DB2' are selectively output through both the first and second output units 244 and 246, or sequentially output only through the first output unit 244. The test mode signal generator 258 generates the test mode signal TM_XNB to disable the second output unit 246. For example, the test mode signal generator 258 generates the test mode signal TM_XNB of a logic low level during the normal mode, and generates the test mode signal TM_XNB of a logic high level during the test mode. The test mode signal generator 258 may be implemented with a bonding option circuit or a vendor test-mode circuit.

Figure 6:
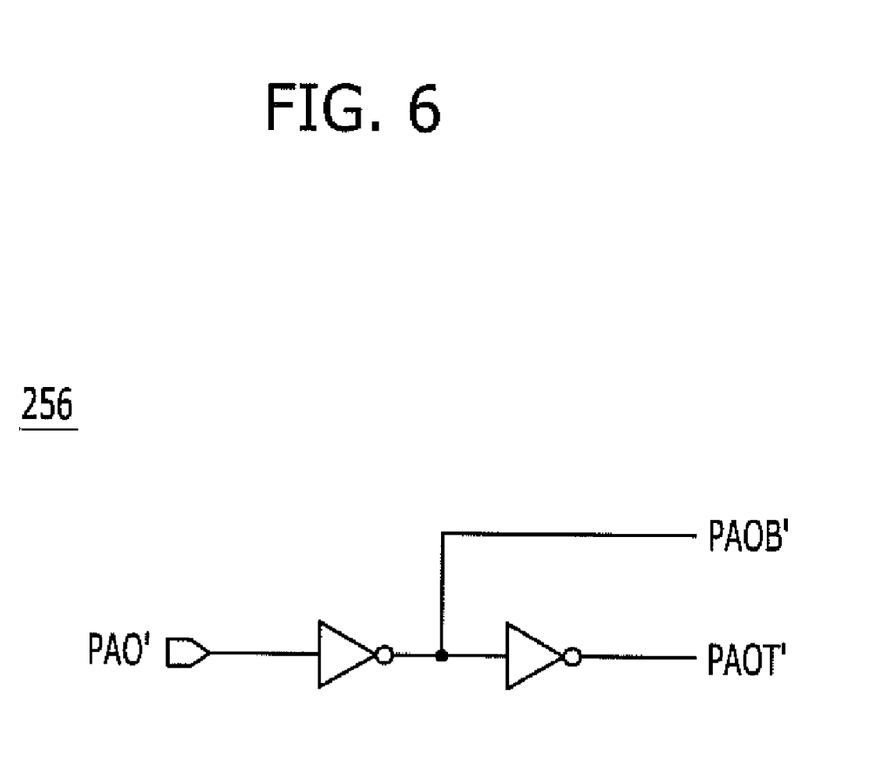
FIG. 6 is a circuit diagram of an output dividing signal generator illustrated in FIG. 4.

FIG. 6 is a circuit diagram of the output dividing signal generator 256 illustrated in FIG. 4.

Referring to FIG. 6, the output dividing signal generator 256 differentially generates the positive and negative output dividing signals PAOT' and PAOB' based on an address signal PAD' synchronized with a clock signal (not shown). In particular, in an exemplary embodiment of the present invention, a logic level of the address signal PAD' may transition once during the test mode. Accordingly, the output dividing signal generator 256 generates the positive and negative output dividing signals PAOT' and PAOB' whose logic level changes once during the test mode.

Meanwhile, although it is not shown to the drawings, an output driving unit may be provided between the first output unit 244 and the first bump pad 210, and configured to drive the first bump pad 210 in response to one of the first and second latched data DB1' and DB2'. Likewise, an output driving unit may be also provided between the second output unit 246 and the second bump pad 220.

Hereinafter, referring to FIG. 7, an operation of the main semiconductor IC 200 depending on whether the main conductor IC 200 operates in the normal mode or the test mode is explained in detail.

Figure 7:
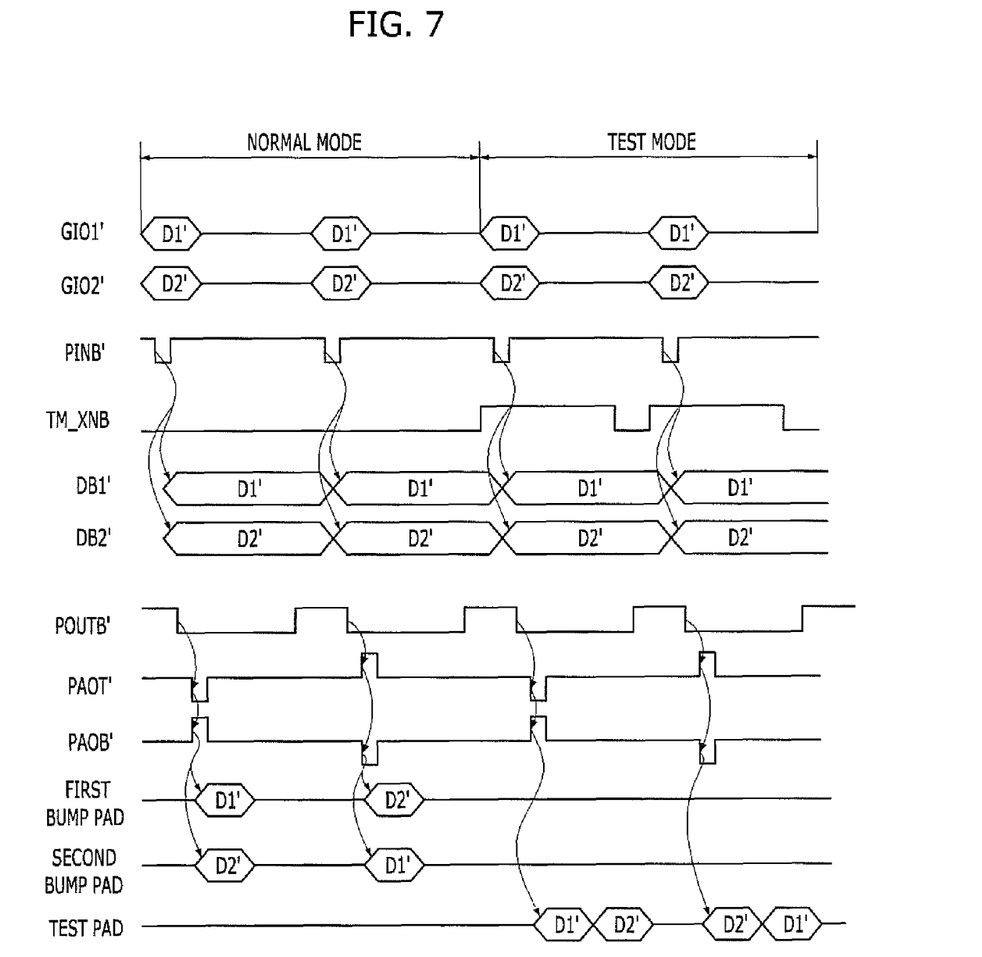
FIG. 7 is a waveform diagram illustrating an operation of a main semiconductor IC in accordance with an embodiment of the present invention.

FIG. 7 is a waveform diagram illustrating an operation of a main semiconductor IC in accordance with an embodiment of the present invention.

Referring to FIG. 7, in the normal mode, the test mode signal generator 258 in FIG. 4 outputs the test mode signal TM_XNB of a logic low level. As a result, the third and fourth path output units 246A and 246B of the second output unit 246 are enabled in response to the test mode signal TM_XNB.

Under this circumstance, in reference to FIG. 5, the first and second data D1' and D2' of a memory cell selected by a read command are input to the input unit 242 through the first and second data lines GIO1' and GIO2'. At this time, the input unit 242 latches the first and second data D1' and D2' to output the first and second latched data DB1' and DB2' when the pipe input control signal PINB' is activated to a logic low level.

Subsequently, when the pipe output control signal POUTB' is activated to a logic low level, the first and second output units 244 and 246 selectively output the first and second latched data DB1' and DB2' to the first and second bump pads 210 and 220 in response to the positive and negative output dividing signals PAOT' and PAOB'.

In detail, when the output dividing signal generator 256 outputs the positive output dividing signal PAOT' of a logic low level and the negative output dividing signal PAOB' of a logic high level, the first path output unit 244A and the fourth path output unit 246B are enabled. Accordingly, the first output unit 244 outputs the first latched data DB1' to the first bump pad 210, and the second output unit 246 outputs the second latched data DB2' to the second bump pad 220.

On the other hand, when the output dividing signal generator 256 outputs the positive output dividing signal PAOT' of a logic high level and the negative output dividing signal PAOB' of a logic low level, the second path output unit 244B and the third path output unit 246A are enabled. Accordingly, the first output unit 244 outputs the second latched data DB2' to the first bump pad 210, and the second output unit 246 outputs the first latched data DB1' to the second bump pad 220.

Next, in the test mode, the test mode signal generator 258 may output the test mode signal TM_XNB of a logic high level. As a result, the third and fourth path output units 246A and 246B of the second output unit 246 are disabled in response to the test mode signal TM_XNB. In the test mode, a probe tip for a probe test (not shown) may be coupled to the probe test pad 230 and 140.

Under this circumstance, the first and second data D1' and D2'of a memory cell selected according to a read command are input to the input unit 242 through the first and second data lines GIO1' and GIO2'. At this time, the input unit 242 latches the first and second data D1' and D2' to output the first and second latched data DB1' and DB2' when the pipe input control signal PINB' is activated to a logic low level.

Subsequently, when the pipe output control signal POUTB' is activated to a logic low level, the first output unit 244 sequentially outputs the first and second latched data DB1' and DB2' to the probe test pad 230 in response to the positive and negative output dividing signals PAOT' and PAOB'.

In detail, when the output dividing signal generator 256 outputs the positive output dividing signal PAOT' of a logic low level and the negative output dividing signal PAOB' of a logic high level, the first path output unit 244A is enabled while the second path output unit 244B is disabled. Accordingly, the first latched data DB1' is output to the probe test pad 230 through the enabled first path output unit 244A.

After the first latched data DB1' is output to the probe test pad 230, the output dividing signal generator 256 outputs the positive output dividing signal PAOT' whose logic level changes to a logic high level from a logic low level, and the negative output dividing signal PAOB' whose logic level changes to a logic low level from a logic high level. Accordingly, since the first path output unit 244A is disabled and the second path output unit 244B is enabled, the second latched data DB2' is output to the probe test pad 230 through the enabled second path output unit 244B.

In the main semiconductor IC in accordance with the exemplary embodiments of the present invention, in which a probe test pad is arranged per two bump pads, the overall chip area of the semiconductor IC may be minimized/reduced. In particular, since a net-die of a wafer may increase by improving an arrangement of the entire chip area of the semiconductor IC, it is possible to reduce a production cost of the semiconductor IC.

While the present invention has been described with respect to specific embodiments, it will be apparent to those skilled in the art that various changes and modifications may be made without departing from the spirit and scope of the present invention as defined by the following claims.

What is claimed is:

1. A semiconductor integrated circuit, comprising:
    first and second bump pads configured to output data;
    a probe test pad coupled to the first bump pad; and
    a pipe latch unit configured to selectively transfer data loaded on first and second data lines to one of the first and second bump pads in response to a pipe output dividing signal during a normal mode, and sequentially transfer the data loaded on the first and second data lines to the probe test pad in response to the pipe output dividing signal during a test mode.

2. The semiconductor integrated circuit of claim 1, wherein the pipe latch unit comprises:
    an input unit configured to receive and latch first and second data in response to a pipe input control signal to output first and second latched data;
    a first output unit configured to output one of the first and second latched data to the first bump pad in response to the pipe output dividing signal and a pipe output control signal during the normal mode, and sequentially output the first and second latched data to the probe test pad in response to the pipe output control signal and the pipe output dividing signal during the test mode; and
    a second output unit configured to output the other of the first and second latched data to the second bump pad in response to the pipe output dividing signal and the pipe output control signal during the normal mode.

3. The semiconductor integrated circuit of claim 2, wherein the first output unit is enabled during both of the normal and test modes, and the second output unit is enabled during the normal mode and disabled during the test mode.

4. The semiconductor integrated circuit of claim 2, wherein the pipe output dividing signal has a logic level transitioning once during the test mode.

5. The semiconductor integrated circuit of claim 4, further comprising:
    an input control signal generator configured to generate the pipe input control signal;
    an output control signal generator configured to generate the pipe output control signal;
    an output dividing signal generator configured to differentially output the pipe output dividing signal as positive and negative pipe output dividing signals; and
    a test mode signal generator configured to generate a test mode signal to disable the second output unit during the test mode.

6. The semiconductor integrated circuit of claim 5, wherein the first output unit comprises:
    a first path output unit configured to output the first latched data in response to the positive pipe output dividing signal; and
    a second path output unit configured to output the second latched data in response to the negative pipe output dividing signal.

7. The semiconductor integrated circuit of claim 5, wherein the first path output unit comprises:
    a first NOR gate configured to perform a NOR operation on the pipe output control signal and the positive pipe output dividing signal;
    a first inverter configured to invert an output of the first NOR gate; and
    a first tri-state inverter configured to invert and output the first latched data in response to an output of the first inverter.

8. The semiconductor integrated circuit of claim 5, wherein the second path output unit comprises:
    a second NOR gate configured to perform a NOR operation on the pipe output control signal and the negative pipe output dividing signal;
    a second inverter configured to invert an output of the second NOR gate; and
    a second tri-state inverter configured to invert and output the second latched data in response to an output of the second inverter.

9. The semiconductor integrated circuit of claim 5, wherein the second output unit comprises:
    a third path output unit configured to output the first latched data in response to the negative pipe output dividing signal; and
    a fourth path output unit configured to output the second latched data in response to the positive pipe output dividing signal.

10. The semiconductor integrated circuit of claim 9, wherein the third path output unit comprises:
    a third NOR gate configured to perform a NOR operation on the pipe output control signal, the negative pipe output dividing signal, and the test mode signal;
    a third inverter configured to invert an output of the third NOR gate; and
    a third tri-state inverter configured to invert and output the first latched data in response to an output of the third inverter.

11. The semiconductor integrated circuit of claim 9, wherein the fourth path output unit comprises:
    a fourth NOR gate configured to perform a NOR operation on the pipe output control signal, the positive pipe output dividing signal, and the test mode signal;
    a fourth inverter configured to invert an output of the fourth NOR gate; and
    a fourth tri-state inverter configured to invert and output the second latched data in response to an output of the fourth inverter.

12. The semiconductor integrated circuit of claim 5, wherein the test mode signal generator comprises a bonding option circuit or a vendor test-mode circuit.

13. A method for driving a semiconductor integrated circuit, the method comprising:
    selectively transferring first and second data loaded on first and second data lines to one of first and second bump pads in response to a pipe output dividing signal during a normal mode; and
    sequentially transferring the first and second data loaded on the first and second data lines to a probe test pad coupled to the first bump pad in response to the pipe output dividing signal during a test mode.

14. The method of claim 13, further comprising:
    receiving and latching the first and second data in response to a pipe input control signal to output first and second latched data.

15. The method of claim 14, wherein one of the first and second latched data is output to the first bump pad and the other of the first and second latched data is output to the second bump pad in response to the pipe output dividing signal and a pipe output control signal during the normal mode; and the first and second latched data are sequentially output to the probe test pad in response to the pipe output control signal and the pipe output dividing signal during the test mode.

16. The method of claim 13, wherein the pipe output dividing signal has a logic level transitioning once during the test mode.

* * * * *